United States Patent
Nair et al.

(10) Patent No.: US 8,212,436 B2
(45) Date of Patent: Jul. 3, 2012

(54) APPARATUS FOR HARVESTING ELECTRICAL POWER FROM MECHANICAL ENERGY

(75) Inventors: Balakrishnan Nair, Sandy, UT (US); Jesse Alan Nachlas, Salt Lake City, UT (US); Andrew Joseph Gill, Salt Lake City, UT (US); Zachary Murphree, Salt Lake City, UT (US)

(73) Assignee: Oscilla Power, Inc., Salt Lake City, UT (US)

( * ) Notice: Subject to any disclaimer, the term of this patent is extended or adjusted under 35 U.S.C. 154(b) by 0 days.

(21) Appl. No.: 13/016,895

(22) Filed: Jan. 28, 2011

(65) Prior Publication Data
US 2011/0316362 A1 Dec. 29, 2011

Related U.S. Application Data

(60) Provisional application No. 61/328,396, filed on Apr. 27, 2010, provisional application No. 61/300,438, filed on Feb. 1, 2010.

(51) Int. Cl.
*H01L 41/00* (2006.01)

(52) U.S. Cl. .......................... 310/26; 310/339
(58) Field of Classification Search ................. 310/26, 310/339
See application file for complete search history.

(56) References Cited

U.S. PATENT DOCUMENTS

| 2,930,911 A * | 3/1960 | Youell et al. ............... 310/26 |
| 3,044,028 A * | 7/1962 | Harris ...................... 333/186 |
| 5,357,232 A * | 10/1994 | Suzuki et al. ............. 335/215 |
| 7,816,799 B2 * | 10/2010 | Nair et al. .................. 290/44 |
| 2006/0255663 A1 * | 11/2006 | Vlad ........................... 310/26 |
| 2008/0258581 A1 * | 10/2008 | Schmidt ................... 310/348 |
| 2011/0057458 A1 * | 3/2011 | Lee et al. ................ 290/1 R |
| 2011/0140577 A1 * | 6/2011 | Galchev et al. ........... 310/339 |

* cited by examiner

*Primary Examiner* — Thomas Dougherty
(74) *Attorney, Agent, or Firm* — Jeffrey T. Holman (57) ABSTRACT

An apparatus for harvesting electrical power from mechanical energy is described. The apparatus includes: a flux path. The flux path includes: a magnetic material having a magnetic property that is a function of stress on the magnetic material; a first magnetically conductive material proximate the magnetic material; a magnet in the flux path, wherein a magnetomotive force of the magnet causes magnetic flux; and a component configured to transfer changes in load caused by an external source to the magnetic material.

20 Claims, 9 Drawing Sheets

APPARATUS FOR HARVESTING ELECTRICAL POWER FROM MECHANICAL ENERGY

CROSS-REFERENCE TO RELATED APPLICATIONS

This application claims the benefit of U.S. Provisional Application No. 61/328,396, filed on Apr. 27, 2010, and entitled "Mechanical Energy Harvester Method and Device," which is incorporated by reference herein in its entirety. This application also claims the benefit of U.S. Provisional Application No. 61/300,438, filed on Feb. 1, 2010 and entitled "Wave Energy Harvester with Improved Performance."

STATEMENT OF FEDERALLY SPONSORED RESEARCH

This invention was made with Government support under U.S. Grant No. WC133R10CN0220 awarded by the National Oceanic and Atmospheric Administration. The Government has certain rights to this invention.

BACKGROUND

Wide deployment of renewable energy sources that are both commercially viable and environmentally benign unquestionably ranks as one of today's global grand challenges. Such technologies may fuel economic growth and contribute to global environmental sustainability, and also reduce our dependence on exhaustible fossil fuels in the coming decades. Ocean power and other renewable energy sources have very high potential but are under-utilized sources for clean energy that would accomplish these objectives.

The Energy Information Administration estimates that global electricity consumption will increase from 18 to 32 trillion kWh between 2006 and 2030, reflecting an annual growth rate of 2.4%. Coal power is forecast to deliver 42% of this global increase, followed by renewables at 24% and natural gas at 23%, with nuclear power contributing the balance. U.S. electricity consumption will increase at a slower rate, climbing from 4.1 to 5.2 trillion kWh over this time period. Coal power is forecast to deliver 39% of this domestic increase, followed by renewables at 32% and natural gas at 18%. The bulk of the contribution from renewables is projected to come from new hydropower rather than less environmentally compromising renewables.

The identification and development of new cost-effective, energy-efficient and environmentally friendly power generation technologies will result in economic, health and security benefits to the U.S. and global populations. Since clean energy generation is generally based on local resources, these technologies can help fuel the local economies of coastal areas through job creation and the availability of inexpensive energy to fuel local industries.

A high proportion of the market share growth in the clean energy sector may go to energy sources that have the capital efficiency, cost effectiveness, and resource availability to scale quickly over the next two decades. Conventional approaches to harvesting ocean energy, for example, have been delinquent across all three of these criteria—they are too capital intensive, have non-competitive energy costs, and require very specific ocean environments which limits the number of potential locations and thus the scale of impact. As such, conventional ocean energy systems are not considered to be in the same class as wind, solar photovoltaic, solar thermal, and geothermal when it comes to impact potential.

The cost of electricity from conventional devices is estimated to be 3-5 times that of coal power. Without radical departures from the conventional approach tried to date, it is plausible that ocean energy will never be a material part of the global energy mix.

SUMMARY

Embodiments of an apparatus are described. In one embodiment, the apparatus is an apparatus for harvesting electrical power from mechanical energy. The energy harvesting apparatus includes a flux path. The flux path includes a magnetic material having a magnetic property that is a function of stress on the magnetic material; a first magnetically conductive material proximate the magnetic material; a magnet in the flux path, wherein a magnetomotive force of the magnet causes magnetic flux; and a component configured to transfer changes in load caused by an external source to the magnetic material.

Another embodiment of the apparatus is described. In one embodiment, the apparatus is an apparatus for harvesting electric power from mechanical energy. The apparatus includes one substantially closed flux path. The flux path includes a magnetic material that has a magnetic property, wherein the magnetic property changes with stress; a magnetically conductive material; and a permanent magnet in the flux path. The apparatus also includes a component configured to transfer changes in load caused by an external source to the magnetic material and at least one other component that is used to apply a pre-stress on the magnetic material. Other embodiments of the apparatus are also described.

Embodiments of a method are also described. In one embodiment, the method is a method for harvesting electrical power from mechanical energy. The method includes: altering a magnetic property of a magnetic material with a component configured to transfer changes in load by an external source to the magnetic material, wherein the magnetic property is a function of stress on the magnetic material; changing a magnetic flux due to a magnetomotive force applied by at least one permanent magnet in a substantially closed flux path with no air gaps; and inducing a voltage in conductive coils arranged relative to the flux path in response to changes in the magnetic flux within the magnetic material.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments present a method and device for harvesting electric power from mechanical energy. More specifically, embodiments describe a magnetic material having a magnetic property that is a function of stress on the magnetic material that can be manipulated using a component that transfers changes in load caused by an external source to the material, altering the magnetic property of the material. This alteration of the magnetic property may then be used to produce an electrical current or voltage. In some embodiments, a magnet is positioned proximate the magnetic material or proximate the load transfer component to alter magnetic properties of the magnetic material.

At least some of the embodiments present a method and device for harvesting electrical power from mechanical energy that includes a flux path that includes: a magnetic material having a magnetic property that is a function of stress on the magnetic material; at least one magnetically conductive material proximate at least one magnetic material; at least one magnet in the flux path, wherein the magnetomotive force of the magnet results in magnetic flux within the magnetic material through the at least one magnetically conductive material; and at least one component configured to transfer changes in load caused by an external source to the magnetic material.

The term "magnetic material" as used herein is broadly understood to include materials that are generally known to possess specific magnetic properties such as magnetostrictive materials, piezomagnetic materials, etc., but do not include permanent magnet materials.

An embodiment of an energy harvesting device includes at least one flux path composed of at least one magnetically conductive material with a relative permeability greater than 100, at least one magnet, at least one magnetic material that has at least one magnetic property that is a function of stress on that material, and a design that allows mechanical load or vibrations to be transferred to that material, at some non-zero frequency. The magnet may be a permanent magnet or an electromagnet, and provides a bias magnetic field to the magnetic material. The magnet may direct a portion of the magnetic flux through the magnetically conductive material.

In some embodiments of the device, one specific property that changes with the stress in the material is the magnetic permeability. In another embodiment, the specific property that changes with stress is the saturation magnetization. In one embodiment of the device, there are no air gaps in the flux path. In another embodiment of the device, the magnetic material is a magnetostrictive material. In another embodiment of the device, the magnetic material is put in a state of pre-stress when no external forces are acting on the material, such that when an external force does act, it may partially overcome or add to the pre-stress. In another embodiment of the device, the magnetic material is put in a state of high compressive stress, typically greater than 1000 psi, and in some embodiments greater than 5000 psi.

The device may also include electrically conductive coils, such as copper coils that are configured such that changes in magnetic flux through the magnetic material will induce voltage and/or current in the coils. The type and specific configuration of the coils in no way limits the scope of this invention. The coils may be insulated to prevent current from transferring to other conductive materials and/or to protect the coils from the environment in which the energy harvesting device is to be used. In addition, the device may include various components and structures designed to transfer or carry loads that are mechanically coupled directly or indirectly to the magnetic material. In some embodiment, one or more of the devices may be connected electrically in series or parallel to increase the amount of electrical energy harvested for a particular application or to provide various different amounts of energy in an application.

A potential benefit of one embodiment of the energy harvesting device is the ability to harvest power with no significant required motion in any of the components of the device.

Embodiments of the invention also cover a method for harvesting and/or generating power using a device as described herein. Various applications of the device may be construed, and the specific use of such a device in no way limits its scope. Specific embodiments of the device may be used in harvesting energy from ocean waves, wind, structural components, machines and/or vibrating components.

A variety of methods and devices may implement the principles described herein for applying and holding a pre-stress on the magnetic material including, but not limited to, mechanical loading with loading equipment and mechanical locking, thermal expansion based techniques and incorporation of the pre-stress during materials processing.

In some embodiments, the magnetic material is a metal alloy. In some embodiments, the magnetic material is an iron-based alloy. In some embodiments, the iron based alloy may contain other elements including, but not limited to, aluminum, cobalt, chromium, gallium, silicon, molybdenum, tungsten, and beryllium. In some embodiments, the magnetic material is a terbium-based, nickel-based or cobalt-based material.

The magnetic material for a magnetostrictive device may be selected so as to increase the efficiency of the energy harvesting apparatus. Possible criteria may include:

1. For high energy efficiency, a high value for the derivative of the magnetization with respect to stress may be used. In other words, a small change in stress results in a high change of the intensity of the magnetic field.
2. The material may possess low hysteresis in the strain-magnetization curve. A low hysteresis results in low magnetomechanical coupling losses, again resulting in improved energy efficiency.
3. The material may have a high internal resistance. A high internal resistance of the alloy results in minimization of eddy currents within the magnetostrictive components and resulting energy loss due to heat generation.
4. The material may be of very low cost (cents/kWh) and therefore exotic/rare and high-cost alloying elements may be avoided.
5. The material may be of low weight (cents/kg) to help reduce installation and/or maintenance costs.

These, and possibly other criteria, may allow the energy harvesting apparatus to be constructed for greater efficiency and/or for lower cost, according to a particular implementation of the apparatus. Other criteria may be used for alternative embodiments using piezomagnetic materials or other embodiments.

In some embodiments of the device, a magnetic flux density change greater than 0.05 Tesla is generated by changes in load on the magnetic material. In some embodiments of the device, changes in magnetic flux density greater than 0.3 Tesla may be obtained. In addition to the maximum change in flux density of the material, other important parameters may determine power generation efficiency as a function of system size and cost.

Figure 1:
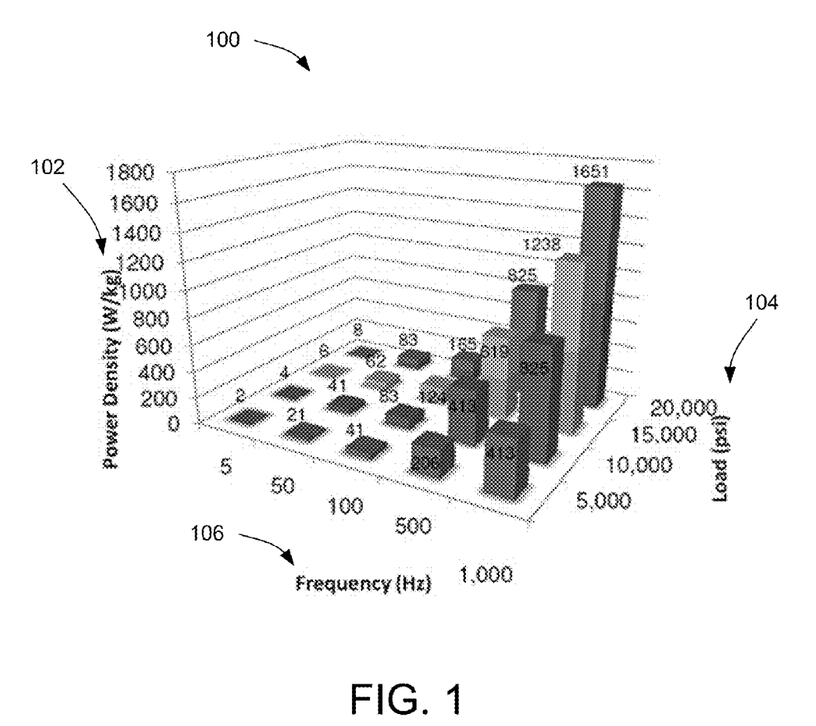
FIG. 1 depicts a graph diagram of one embodiment of a relationship between power density of a magnetostrictive iron-aluminum alloy material as a function of the load applied to the material and the frequency of applying and releasing the mechanical load.

FIG. 1 shows a graph diagram of one embodiment of the relationship 100 between power density 102 (in watts per kilogram) of a magnetostrictive iron-aluminum alloy material as a function of the load 104 applied to the magnetic material and the frequency 106 of applying and releasing the mechanical load 104 in a device configuration as described herein.

To demonstrate a specific embodiment of an energy harvesting apparatus as described herein, an experiment was performed to demonstrate energy generation using a magnetostrictive material that is configured with a bias magnetic field and the ability to change the load 104 condition on the magnetostrictive element. However, other embodiments may vary in one or more aspects from the embodiment described herein. The basic components of the present embodiment of the energy harvesting apparatus include a force generator to apply either a compressive or tensile force to the magnetostrictive element, or a combination of compressive and tensile loads.

Additionally, a bias magnetic field may be superimposed on the magnetostrictive material. This is accomplished by configuring magnets along with magnetically conductive materials (i.e., mild steel, iron, electrical steel, etc.) in such a way as to create a continuous magnetic flux path that goes from the north pole of a magnet through the magnetically conductive materials and the magnetostrictive element and returns to the south pole of the magnet.

Energy generation is accomplished by changing the magnetic properties of the magnetostrictive element via changes in load 104 condition, which results in a change in magnetic flux passing through the magneto strictive element. In one embodiment, the change in magnetic flux with time generates electrical power through the use of a copper coil that surrounds the magnetostrictive element.

Figure 2:
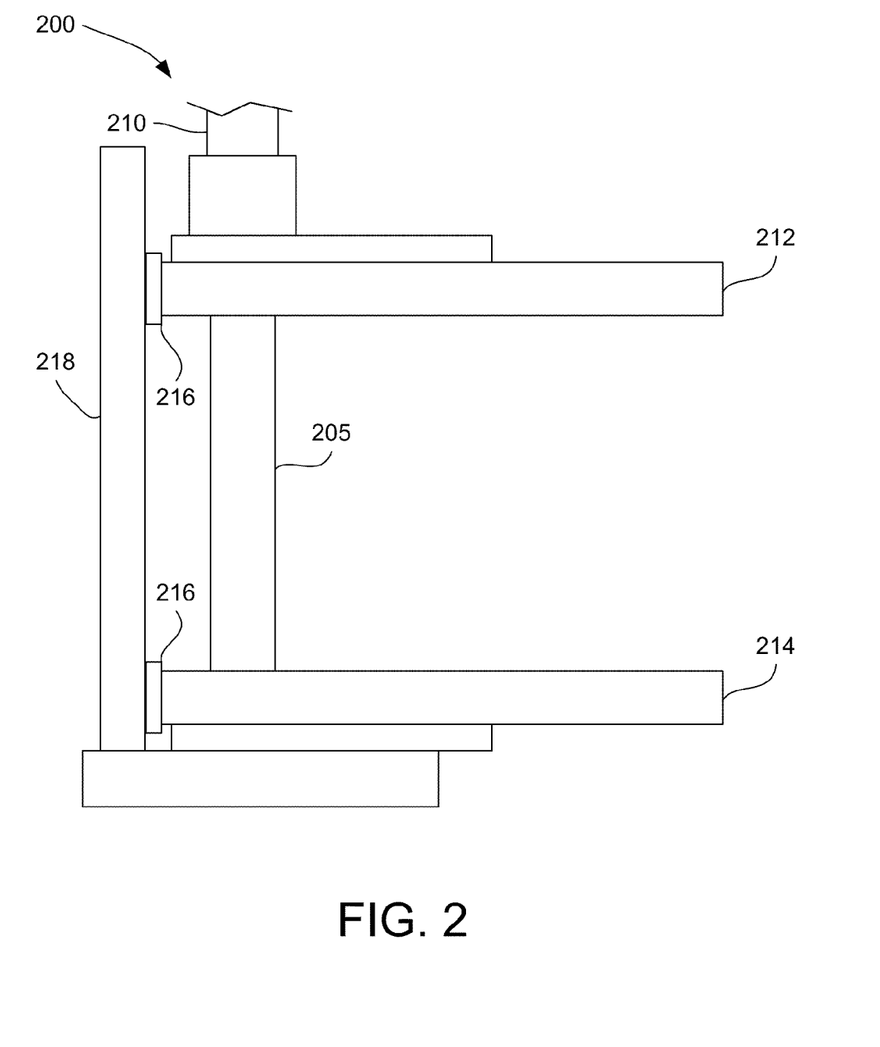
FIG. 2 depicts a schematic diagram of one embodiment of an energy harvesting apparatus.

FIG. 2 depicts a schematic diagram of one embodiment of an energy harvesting apparatus 200. Although a magnetic material 205 is shown and described with the load-application device 210 of FIG. 2, other embodiments of the magnetic material 205 or load-application device 210 may include fewer or more components to implement less or more functionality. An apparatus 200 including both the magnetic material 205 and the load-application device 210 may be used in various energy harvesting structures or devices. For example, an energy harvesting apparatus 200 such as described herein may be used in conjunction with a wave energy harvester. Such energy harvesting structures may include one or many energy harvesting apparatuses either in series or in parallel.

In the embodiment of FIG. 2, a magnetostrictive element having the magnetic material 205 is a 6-inch long cylindrical rod that is 1 inch in diameter. The magnetostrictive element includes a magnetic material 205 as described herein. An electrically conductive coil (not shown) may surround the cylindrical rod. In one embodiment, the coil is made of 14 AWG wire with 180 turns. In one embodiment, at each end of the magnetostrictive rod is a mild steel rectangular bar 212, 214 with dimensions of 1.5 inch by 0.75 inch and 10 inch length. One or more magnets 216 may be positioned at one or both ends of the rectangular mild steel bars 212, 214. The apparatus 200 may also use a magnetically conductive material at each end of the magnetostrictive rod, such as mild steel, to connect the flux path of the magnet 216 on the top bar 212 with the magnet 216 on the bottom bar 214. This may be done by placing another rectangular bar 218 of similar dimensions in the vertical plane, thereby contacting both the magnet 216 at the end of the top bar 212 and the magnet 216 at the end of the bottom bar 214. The resulting configuration creates a closed loop flux path that passes through the magnetic material 205, along with the magnets 216 and magnetically conductive materials 212, 214, 218. Other shapes and types of magnetically conductive materials may be used and are not restricted to those disclosed herein.

Figure 3:
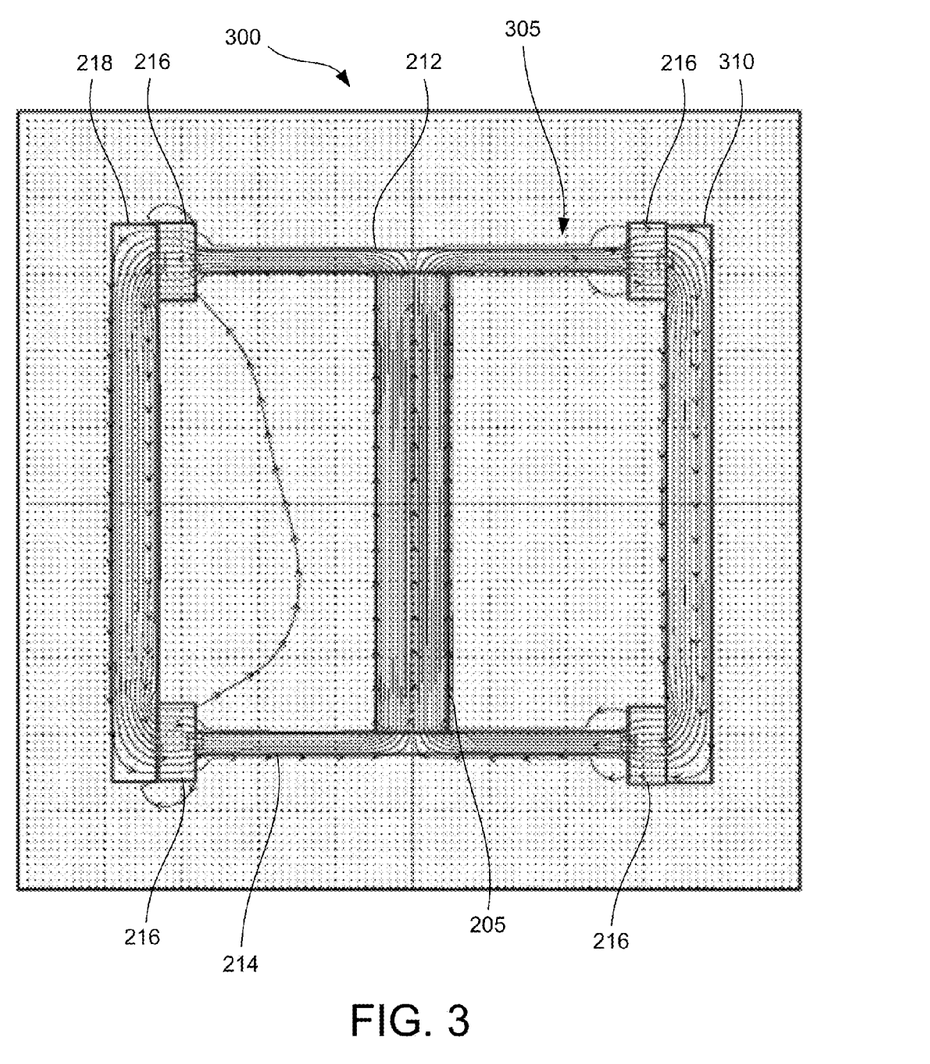
FIG. 3 depicts a computer-modeled schematic diagram of one embodiment of a flux path of a magnetic material within a load-application device.
Figure 4:
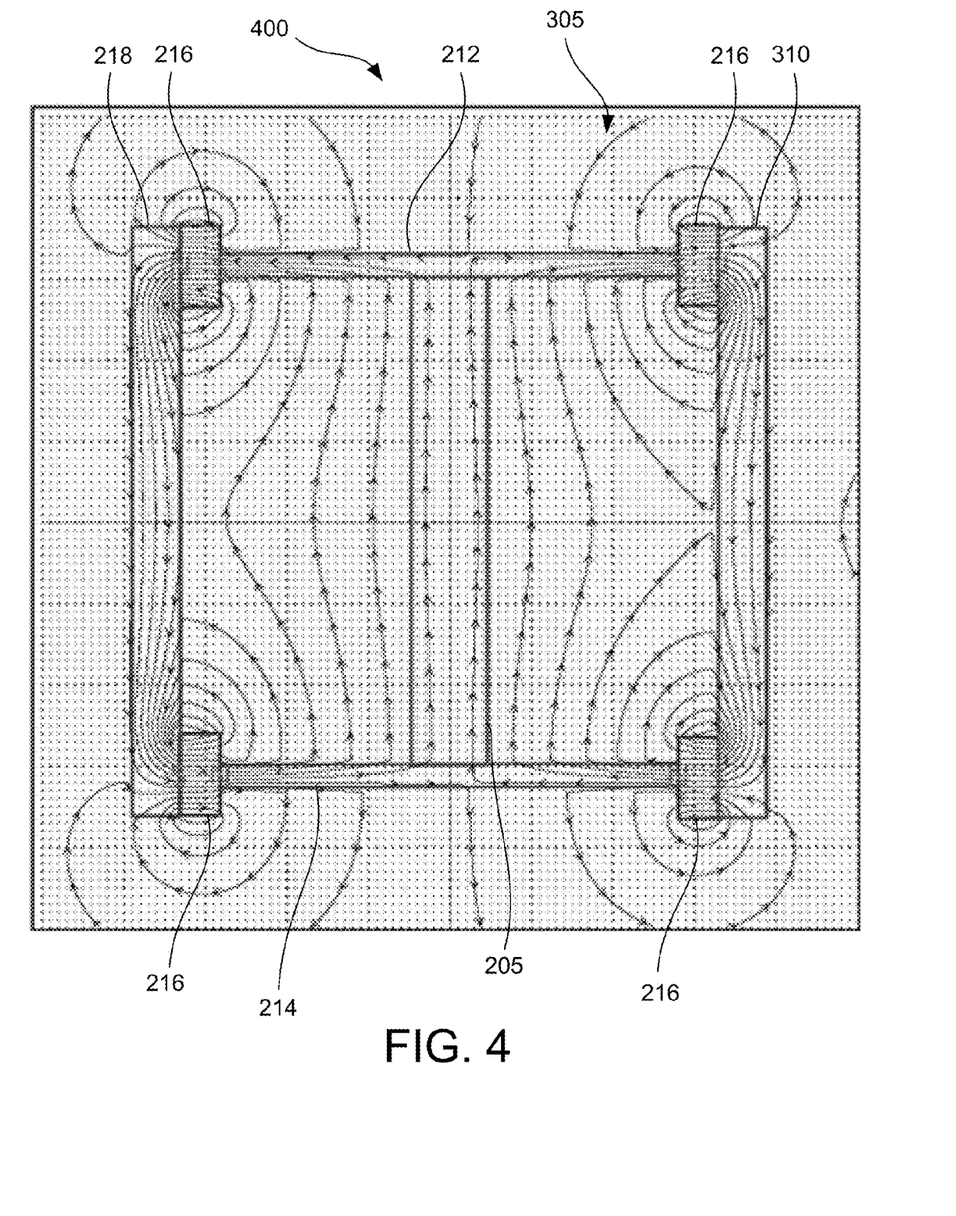
FIG. 4 depicts a computer-modeled schematic diagram of one embodiment of a flux path of a magnetic material within a load-application device.

FIGS. 3 and 4 are computer modeled images 300, 400 (using Vizimag software) of a flux 305 path of the magnetic material 205 within the energy harvesting apparatus 200. The magnetic material may comprise a magnetostrictive material. In this embodiment, the energy harvesting apparatus 200 has two magnetically conductive bars 212, 214 at each end of the magnetostrictive rod. Additionally, magnets 216 are placed at each end of the magnetically conductive bars 212, 214, and additional magnetically conductive bars 218 are placed in contact with the magnets 216 at both the top and bottom bars 212, 214 that are in contact with the magnetostrictive rod. Consequently, top and bottom bars 212, 214 with the magnets 216 and a left bar 218 form a closed loop through which approximately one-half of the magnetic flux is able to pass, and the top and bottom bars 212, 214 with magnets 216 and a right bar 310 form another closed loop through which approximately one-half of the magnetic flux 305 path is able to pass.

Figure 5:
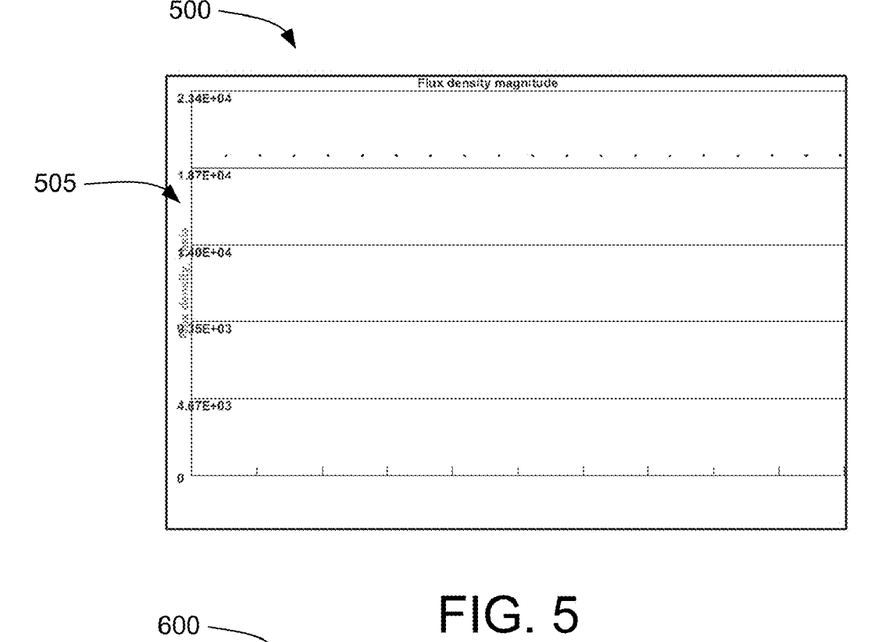
FIG. 5 depicts a graph diagram of a flux density magnitude of the flux path of FIG. 3.
Figure 6:
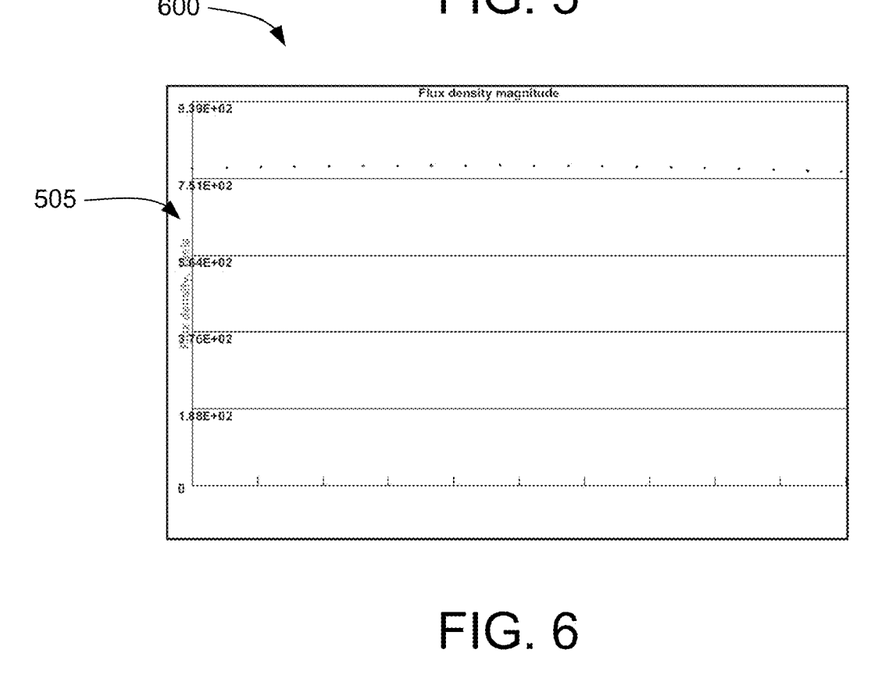
FIG. 6 depicts a graph diagram of a flux density magnitude of the flux path of FIG. 4.

The flux 305 path is shown passing through the closed loop flux path under two mechanical stress load conditions in FIGS. 3 and 4. To generate power, the magnetic flux 305 changes by changing the stress state, or mechanical force load, on the magnetic material 205. In FIG. 3, the flux lines 305 are shown when the stress condition applied to the magnetostrictive rod results in a high magnetic permeability material. When the magnetic material 205 has a high magnetic permeability due to the stress, the majority of the flux passes through the magnetic material 205. FIG. 4 shows a computer model image 400 of the flux lines 305 when the stress state imposed on the magnetic material 205 in the rod results in a low magnetic permeability condition. Conversely to the high magnetic permeability condition of the material of FIG. 3, many of the flux lines 305 shown when the material 205 is in a low magnetic permeability state pass outside of the materials into free space and loop back to the other pole of the magnet. FIGS. 5 and 6 show graphs 500, 600 of the magnetic flux magnitude 505 under the corresponding flux conditions of FIGS. 3 and 4, respectively.

Because the amount of flux 305 through the magnetostrictive rod changes relative to the stress state imposed on the magnetic material 205 by the load-transfer component 210, an electrically conductive coil wound around the rod and connected to an electrical circuit begins to conduct current with the change in flux 305 through the coil. The amount of voltage generated in the coil is a function of the amount of flux change through the coil and the number of turns in the coil. A higher number of turns results in a higher voltage. In some embodiments, the electrically conductive coil may be a copper wire. In other embodiments, the electrically conductive coil may include one or more electrically conductive materials, including copper or other conductive materials.

In one embodiment of the apparatus 200 described herein, with a magnetostrictive rod having the dimensions and conductive coil as in FIG. 2, a loading experiment was performed where a 16,000 lb. compressive load was applied to the magnetostrictive rod and released to a condition of zero compressive load. The change in load 104 on the magnetostrictive rod resulted in a change in magnetic flux 305 passing through the rod, also changing the flux 305 path through the energy harvesting apparatus 200. The resultant change in magnetic flux 305 generated a voltage of 0.48 volts and a current of 1.92 amps, thereby generating an instantaneous power of 0.92 watts. The ultimate power generation is a function of how many of these loading and unloading cycles can be accomplished in each second of time.

Figure 7:
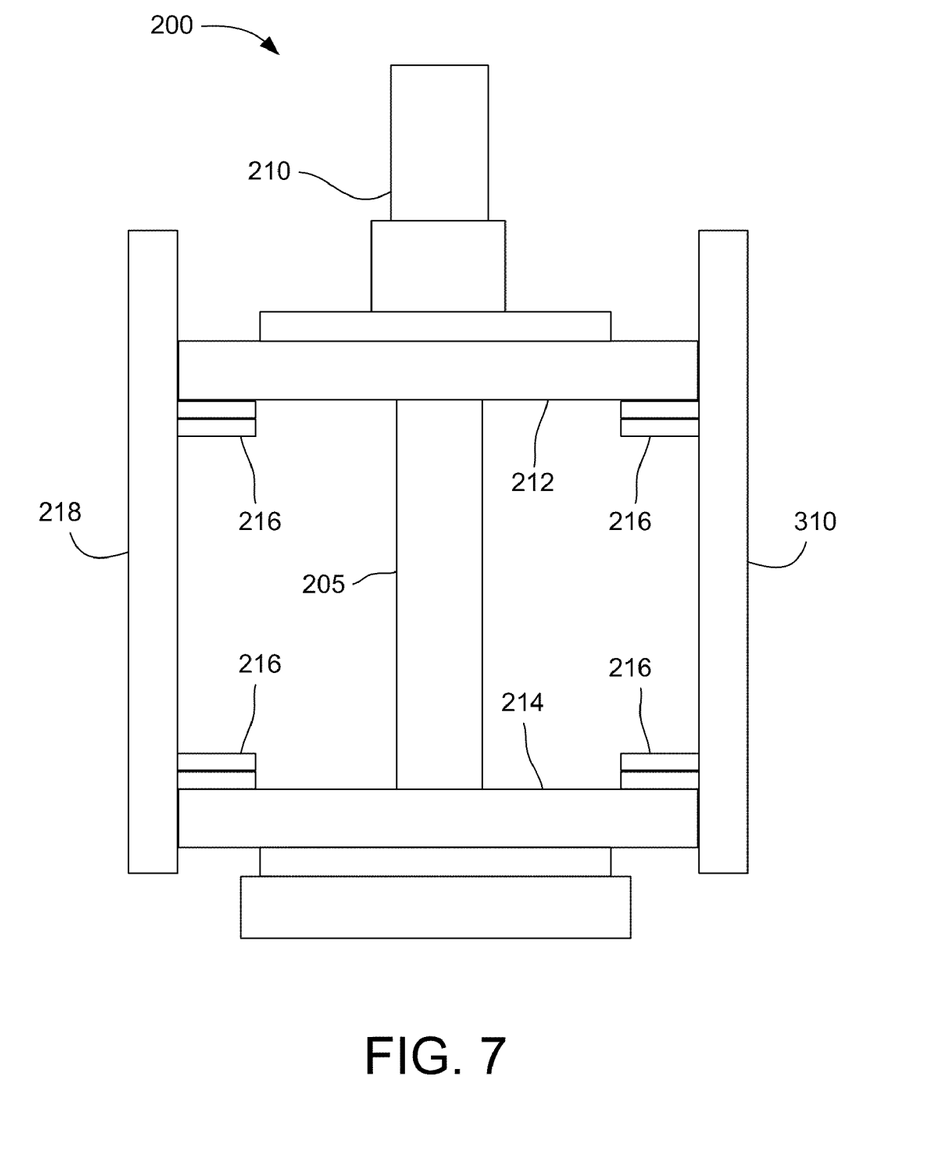
FIG. 7 depicts a schematic diagram of one embodiment of an energy harvesting apparatus.
Figure 8:
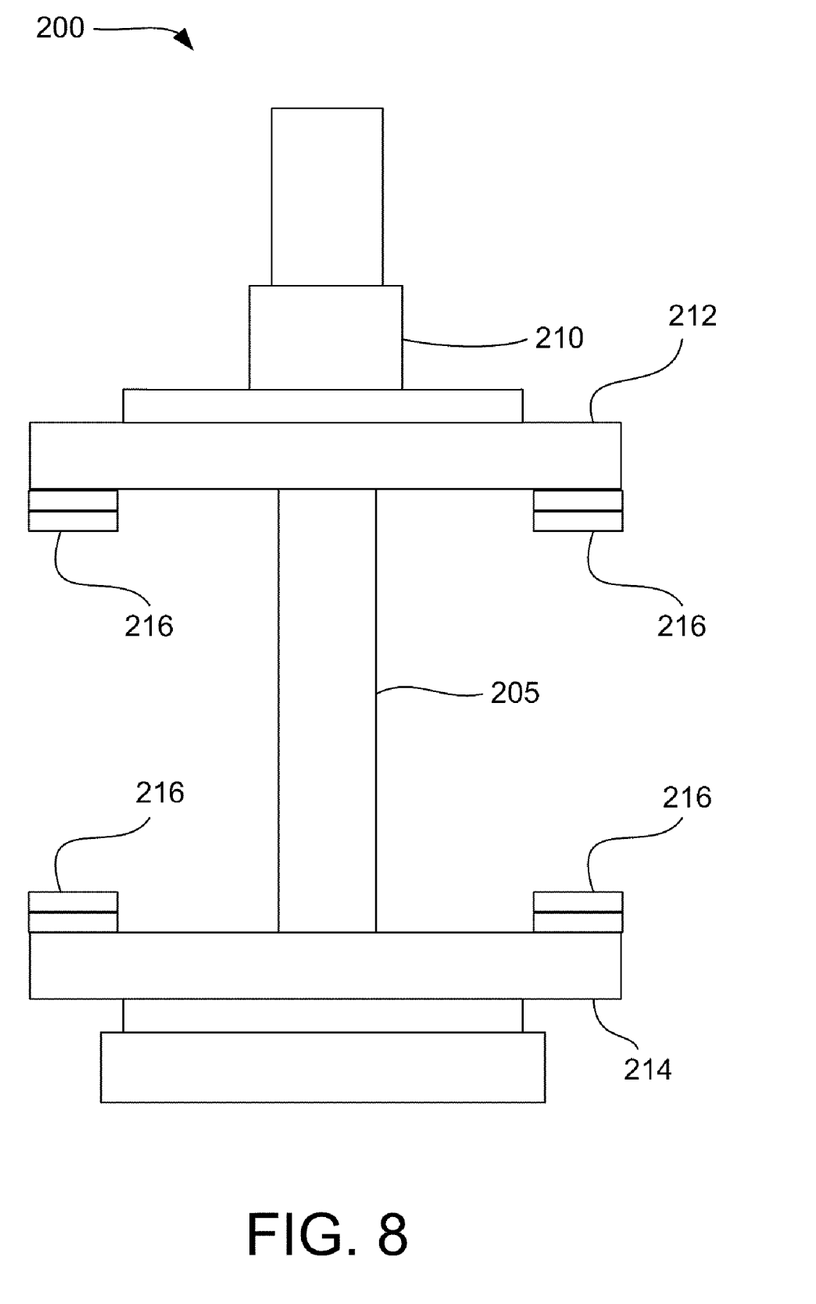
FIG. 8 depicts a schematic diagram of one embodiment of an energy harvesting apparatus.

FIGS. 7 and 8 depict alternative embodiments of an energy harvesting apparatus 200. The magnetic flux 305 path may or may not be completely closed using high magnetic permeability materials. The energy harvesting apparatus 200 in FIG. 7 includes magnetically conductive bars 212, 214 at both ends of a magnetostrictive rod having a magnetic material 205, and a second set of magnetically conductive bars 218, 310 at both ends of the first set of magnetically conductive bars 212, 214. Bias magnets 216 are placed within the closed flux path loop formed by the magnetic material 205 and the magnetic bars 212, 214, 218, 310, as opposed to directly in line with the flux 305 path. The bias magnets 216 in this configuration alter the magnetic flux 305 created by the magnetic material 205 without necessarily being within the flux 305 path, though some of the flux 305 may be directed through the magnets 216.

The energy harvesting apparatus 200 of FIG. 8 includes magnetically conductive bars 212, 214 at both ends of the magnetostrictive rod, but does not have any other magnetically conductive material 205 connecting the magnetically conductive bars 212, 214 for forming closed loops of magnetically conductive material 205. Consequently, at least some of the flux 305 passes through an air gap between the top magnetically conductive bar 212 and the bottom magnetically conductive bar 214 for each flux path loop. All configurations described herein result in power generation and demonstrate some of the variables that may be changed to optimize power generation for a given design and application.

Figure 9:
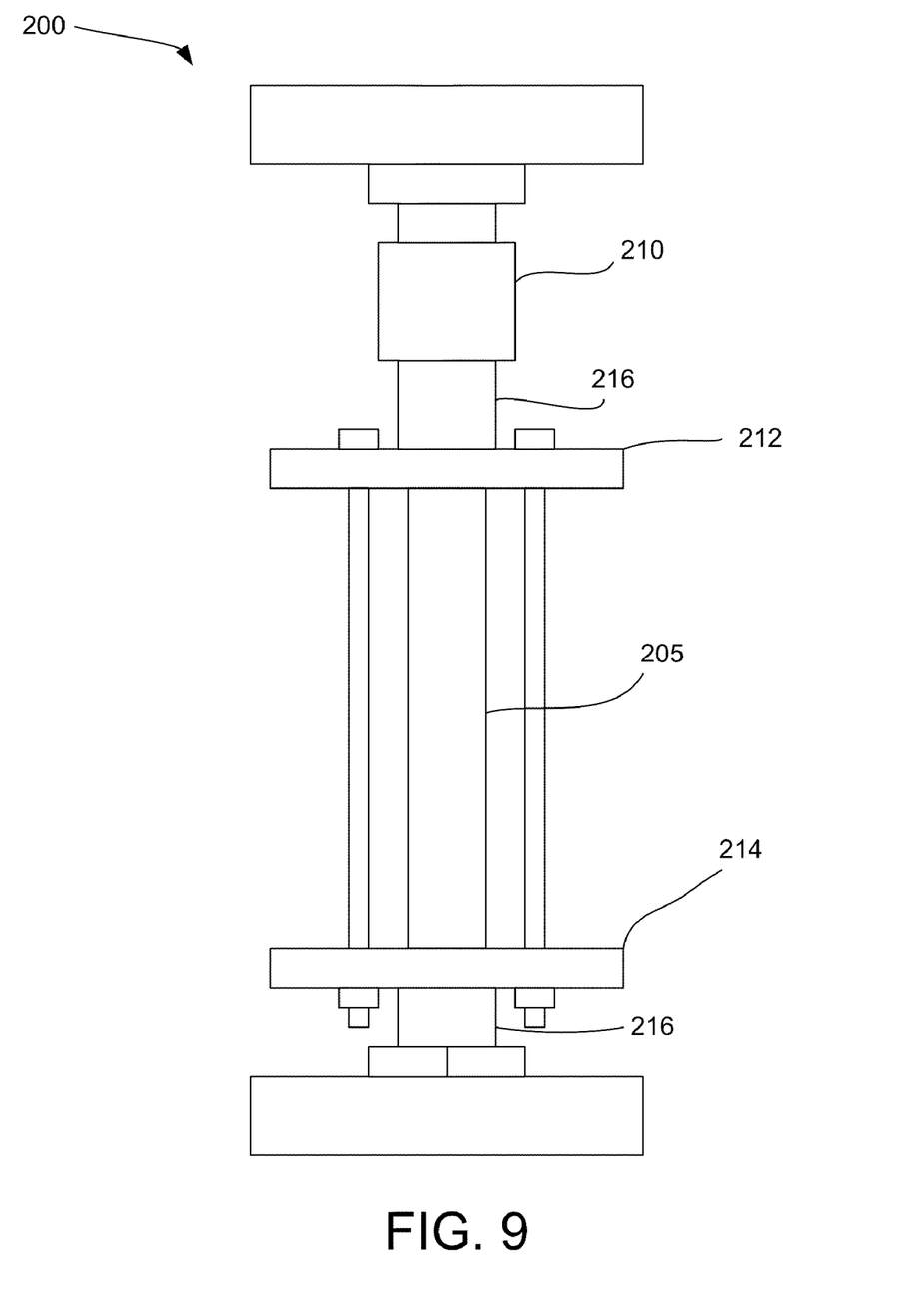
FIG. 9 depicts a schematic diagram of one embodiment of an energy harvesting apparatus.

FIG. 9 depicts another embodiment of an energy harvesting apparatus 200. In this embodiment, the bias magnet 216 or magnets are located at the ends of the magnetic material 205. In one embodiment, the magnets 216 are contained within the load path at the time of applying a pre-stress tensile or compressive load 104 to the magnetic material 205 by the load-application device 210. Consequently, the magnets 216 may be in the load path and therefore be subjected to the forces of either a compressive or tensile load 104. In another embodiment, the pre-stress force is applied to the magnetic material 205 and then the magnets 216 are positioned. In such an embodiment, the magnets 216 are maintained in a position independent of the load path and are not subjected to the compressive or tensile load 104. In some embodiments, when the magnets 216 are part of the load path, the energy harvesting apparatus 200 may be implemented utilizing high strength magnets 216 or operating at lower load 104 ranges so as to prevent the magnets 216 from being damaged or broken, either due to the pre-stress or to external loads 104 placed on the load-application device 210 after the pre-stress is applied.

Any of the embodiments of the load-application devices 210 and/or magnetic materials 205 described herein may be implemented in an energy harvesting apparatus 200, or combinations of the embodiments may be utilized. Other configurations of the energy harvesting apparatus 200, the load-application device 210, and/or the magnetic material 216 may be used in conjunction with any of the principles described herein for harvesting energy.

Figure 10:
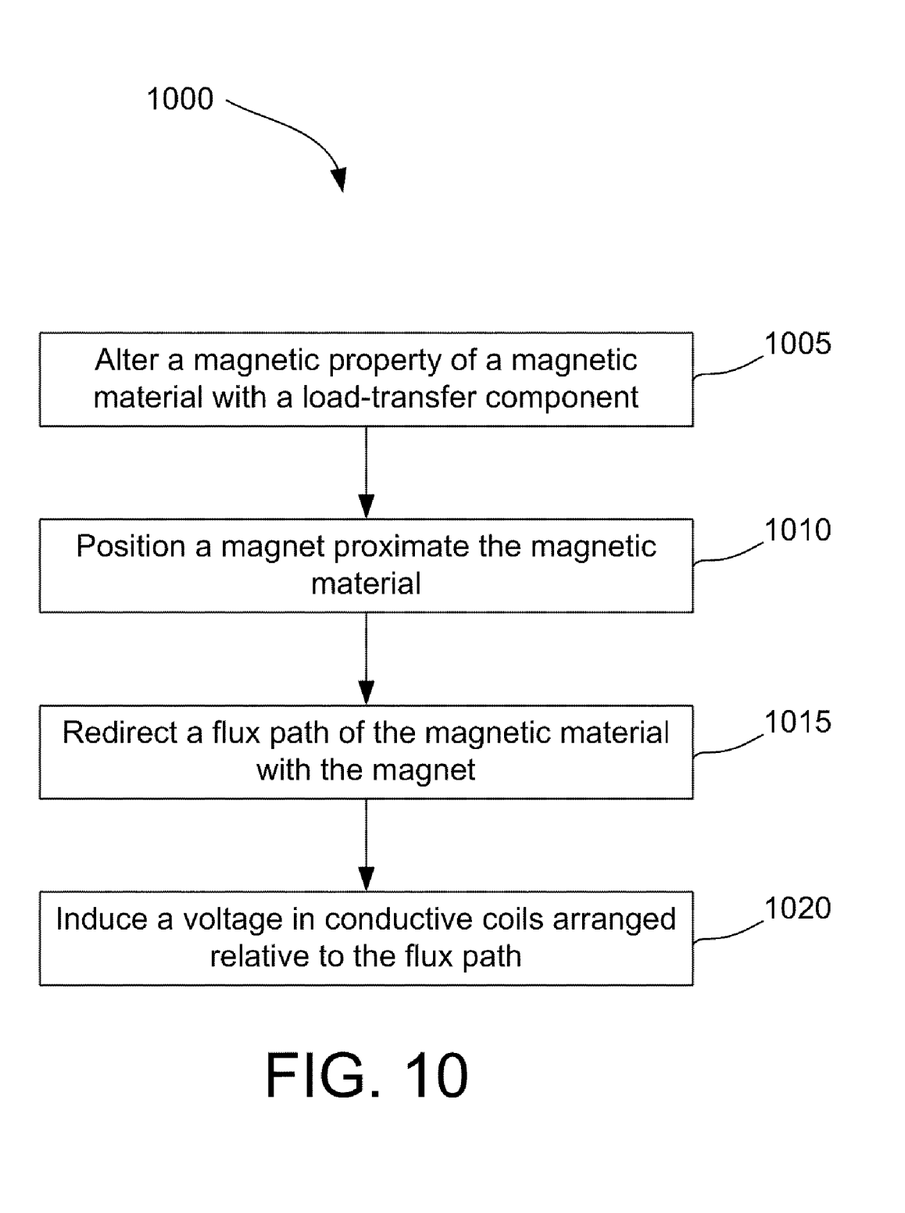
FIG. 10 depicts a flow chart diagram of one embodiment for harvesting electrical power from mechanical energy.

FIG. 10 depicts a flow chart diagram of one embodiment of a method 1000 for harvesting electrical power from mechanical energy. Although the method 1000 is described in conjunction with the energy harvesting apparatus 200 of FIG. 2, embodiments of the method 1000 may be implemented with other types of energy harvesting apparatuses.

The energy harvesting apparatus 200 alters 1005 a magnetic property of the magnetic material 205 using a load-application device 210. The magnetic property may be a function of the amount of stress on the magnetic material 205. One such magnetic property may include the magnetic permeability of the magnetic material 205, such that as stress is applied to the magnetic material 205, the magnetic permeability is altered. In another embodiment, the magnetic property is the saturation magnetization of the magnetic material 205. Increasing the saturation magnetization of the magnetic material 205 may increase the effectiveness of the energy harvesting apparatus 200 in some embodiments. Other properties that may be altered relative to stress include, but are not limited to, derivation of magnetization with respect to the applied stress and magnetostrictive strain.

At least one magnet 216 is then positioned 1010 proximate the magnetic material 205. The magnet 216 redirects 1015 a flux 305 path of the magnetic material 205 to provide a bias magnetic field for the magnetic material 205 and energy harvesting apparatus 200. In one embodiment, the magnet 216 is in contact with the magnetic material 205 at one end of the magnetic material 205. In another embodiment, the magnet 216 is not in contact with the magnetic material 205, but is close enough to alter the flux 305 for a particular bias magnetic field. The magnet 216 may be placed in contact with a first magnetically conductive material that is positioned at a first end of the magnetic material 205. In some embodiments, the area of cross-section of least one magnetically conductive material is substantially the same as the area of cross-section of at least one permanent magnet.

The magnetically conductive material may be a bar 212 having a bore through which the magnetic material 205 passes, and to which the magnetic material 205 may be affixed. In some embodiments, the magnet 216 may be positioned at an end of the magnetically conductive bar 212 such that the magnet 216 lies in the flux 305 path created by the magnetic material 205. A second magnetically conductive bar 214 may be positioned at the second end of the magnetic material 205, and a magnet 216 may be positioned at an end of the second magnetically conductive bar 214, such that the apparatus is generally symmetrical. In other embodiments, magnets 216 may be placed at the ends of the magnetic material 205. The magnets 216 may be in a load path of the load-application device 210.

In some embodiments, the apparatus 200 may have additional magnetically conductive materials, such as a bar 218, to create a substantially closed flux 305 path through magnetically conductive materials from the north magnetic pole of the magnetic material 205 to the south magnetic pole of the magnetic material 205, such that the flux 305 path is substantially free of air gaps. In other embodiments, the energy harvesting apparatus 200 may have one or more air gaps in the flux 305 path.

In some embodiments, the magnets 216 may be positioned within the loops of the flux 305 path, rather than directly in the flux 305 path, such that a majority of the flux 305 does not pass through the magnets 216, while still altering the flux 305 and providing a bias magnetic field for the magnetic material 205. The number and magnetic strength of magnets 216 may be determined according to a particular implementation of the energy harvesting apparatus 200. Embodiments of the energy harvesting apparatus 200 may implement the method 1000 using magnetostrictive materials, piezomagnetic materials, or other kinds of magnetic materials 205.

In one embodiment, electrically conductive coils are arranged relative to the flux 305 path, such that when the flux 305 through the magnetic material 205 changes due to external loads 104 placed on the apparatus 200, a voltage is induced 1020 in the conductive coils. The voltage amount is relative to the type and number of coils, as well as the change of flux 305 through the conductive coils over time. Other methods of inducing a voltage may be implemented with the energy harvesting apparatus 200 described herein.

A pre-stress may be applied to the magnetic material 205 within the energy harvesting apparatus 200, according to principles described herein. The pre-stress may include a compressive or tensile load 104 applied to the magnetic material 205 before positioning the magnets 216 within the energy harvesting apparatus 200 to bias the magnetic field of the magnetic material 205, depending on the embodiment.

In some embodiments, a magnetomotive force of a magnet in the flux path causes magnetic flux within a portion of the flux path that includes a magnetic material and a first magnetically conductive material.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus for harvesting electrical energy from mechanical energy, the apparatus comprising:
   a flux path, comprising:
      a magnetic material having a magnetic property that is a function of stress on the magnetic material;
      a first magnetically conductive material proximate the magnetic material;
      a magnet in the flux path, wherein a magnetomotive force of the magnet causes magnetic flux; and
      a component configured to transfer changes in load caused by an external source to the magnetic material along a load path, wherein the magnet is positioned independently of the load path and is not subjected to the changes in load from the external source.

2. The apparatus in claim 1, further comprising at least one other component that is used to apply a pre-stress on the magnetic material, wherein the pre-stress on the magnetic material is a compressive stress that is separate from the changes in load caused by the external source.

3. The apparatus of claim 1, wherein the magnetically conductive material provides a flux path substantially free of air gaps between a north pole and a south pole of the magnet.

4. The apparatus of claim 1, wherein the first magnetically conductive material comprises mild steel.

5. The apparatus of claim 1, wherein the first magnetically conductive material comprises electrical steel.

6. The apparatus of claim 1, wherein the magnet comprises a permanent magnet positioned with a first pole of the magnet in contact with the load transfer component, the first pole of the magnet facing toward an axis of the magnetic material, and a second pole of the magnet facing away from the axis of the magnetic material.

7. The apparatus of claim 1, wherein the magnet comprises an electromagnet.

8. The apparatus of claim 1, wherein the magnetic material comprises a magnetostrictive material.

9. The apparatus of claim 1, wherein the magnetic material comprises a piezomagnetic material.

10. The apparatus of claim 1, wherein the magnetic property comprises magnetic permeability of the magnetic material that changes with mechanical stress on the magnetic material.

11. The apparatus of claim 1, wherein the magnetic property comprises saturation magnetization of the magnetic material that changes with mechanical stress on the magnetic material.

12. The apparatus of claim 1, further comprising conductive coils arranged relative to the flux path, wherein the conductive coils are configured to produce an induced voltage and/or current in response to changes in magnetic flux through the magnetic material.

13. An apparatus for harvesting electric energy from mechanical energy, the apparatus comprising:
    one substantially closed flux path, comprising:
        a magnetic material that has a magnetic property, wherein the magnetic property changes with stress;
        a magnetically conductive material; and
        a permanent magnet in the flux path, wherein the permanent magnet is oriented with at least one pole of the permanent magnet facing toward the magnetic material;
    a component configured to transfer changes in load caused by an external source to the magnetic material; and
    at least one other component that is used to apply a pre-stress on the magnetic material.

14. The apparatus of claim 13, wherein the magnetic material comprises a magnetostrictive material or a piezomagnetic material.

15. The apparatus of claim 13, wherein the magnetic property comprises magnetic permeability of the magnetic material that changes with mechanical stress on the magnetic material.

16. The apparatus of claim 13, wherein the magnetic property comprises saturation magnetization of the magnetic material that changes with mechanical stress on the magnetic material.

17. The apparatus of claim 13, wherein an area of cross-section of at least one magnetically conductive material is substantially the same as an area of cross-section of at least one permanent magnet.

18. The apparatus of claim 13, further comprising conductive coils arranged relative to the flux path, wherein the conductive coils are configured to produce an induced voltage and/or current in response to changes in magnetic flux through the magnetic material.

19. A method for harvesting electrical energy from mechanical energy, the method comprising:
    altering a magnetic property of a magnetic material with a component configured to transfer changes in load by an external source to the magnetic material along a load path, wherein the magnetic property is a function of stress on the magnetic material;
    changing a magnetic flux due to a magnetomotive force applied by at least one permanent magnet in a substantially closed flux path with no air gaps, wherein the permanent magnet is positioned independently of the load path and is not subjected to the changes in load from the external source; and
    inducing a voltage in conductive coils arranged relative to the flux path in response to changes in the magnetic flux within the magnetic material.

20. The method of claim 19, wherein harvesting electrical power from the mechanical energy further comprises harvesting the electrical power from ocean energy.

* * * * *